United States Patent [19]

Conru et al.

[11] Patent Number: 5,086,018

[45] Date of Patent: Feb. 4, 1992

[54] METHOD OF MAKING A PLANARIZED THIN FILM COVERED WIRE BONDED SEMICONDUCTOR PACKAGE

[75] Inventors: H. Ward Conru, Essex Junction; Gary H. Irish, Jericho; Francis J. Pakulski, Shelburne; William J. Slattery; Stephen G. Starr, both of Essex Junction; William C. Ward, Burlington, all of Vt.

[73] Assignee: International Business Machines Corporation, Armonk, N.Y.

[21] Appl. No.: 694,719

[22] Filed: May 2, 1991

[51] Int. Cl.⁵ ............... H01L 21/56; H01L 21/58; H01L 21/603
[52] U.S. Cl. ............................ 437/207; 437/208; 437/212; 437/220; 437/915
[58] Field of Search ............. 437/207, 208, 211, 212, 437/220, 915, 923

Primary Examiner—Olik Chaudhuri
Assistant Examiner—David E. Graybill
Attorney, Agent, or Firm—Francis J. Thornton

[57] ABSTRACT

A method of making a semiconductor chip in which the conductive path between the chip and the lead frame via wires can be easily and reproduceably improved. This is accomplished by improving the bond between the wires and the lead frame members to which the wires are joined and by creating additional contacts between each wire and its respective lead even if the bonded contact breaks or fails at or immediately adjacent to the bonding point. This is accomplished by placing an insulating layer on the active surface of each chip, carrying input and output bonding pads thereon, to which lead frame conductors have been connected by bonding wires. The insulating layer is a thermosetting adhesive and is placed over the lead frame, the bonding wires and the active face of the semiconductor chip so that when a lamination force is applied to the insulating layer the wires will be crushed and held against their respective pads and against the respective leads to which they are connected and the active face of the semiconductor protected by the adhesive bonding thereto. In this way greater contact between the wires and the leads is enhanced and defects or failure in conductivity therebetween reduced or eliminated.

11 Claims, 4 Drawing Sheets

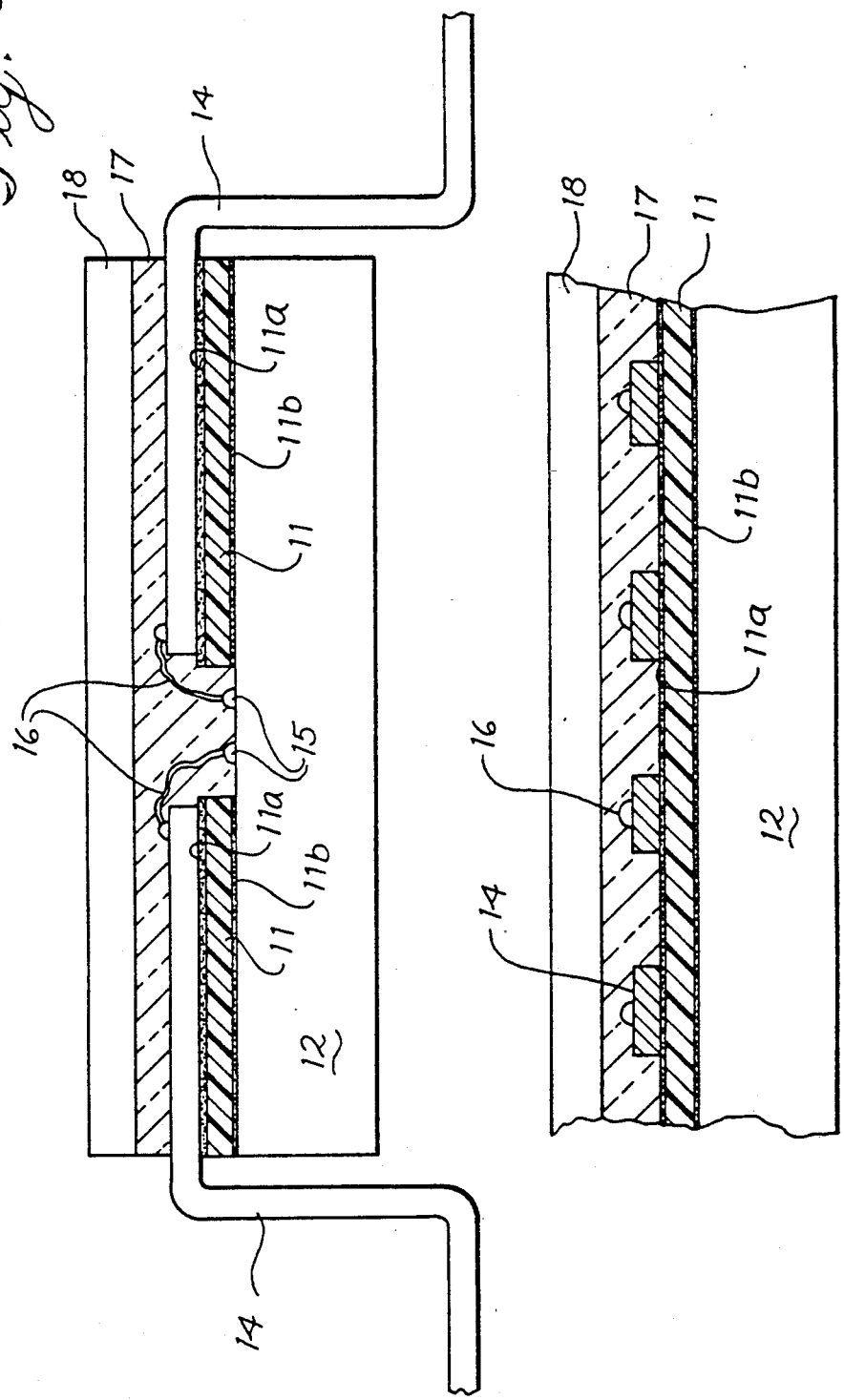

METHOD OF MAKING A PLANARIZED THIN FILM COVERED WIRE BONDED SEMICONDUCTOR PACKAGE

FIELD OF THE INVENTION

This invention relates to wire bonded semiconductor chips. More particularly it relates to a wire bonded chip in which improved wire bond contact occurs and in which the size of the package is minimized.

DESCRIPTION OF THE PRIOR ART

Wire bonding techniques have long been employed to provide an electrical path between the terminals on a semiconductor chip and a fixed lead configuration which provides connections to external devices such as printed circuit boards prior to encapsulation of the chip. Gold wires are commonly used to connect the terminals on the surface of the semiconductor chip to the lead frame conductors and provide this electrical path.

Principally, defects occur where these wires are bonded to the conductive leads. Because of the manner in which the automated bonding technique is presently practiced in the industry, a small but detectable number of such bonds fail thus producing a reliability concern. Such failures occur because of problems with the wire or bonding process, such as low temperature or pressure between the wire and the lead, as well as poor contact between the wire and the lead caused, for example by films or other contaminants on either the wire or the lead or both. Although great care is taken to clearly control all such parameters and eliminate films and other contaminants such failures have, to date, not been entirely and consistently eliminated.

SUMMARY OF THE INVENTION

An object of the invention is to provide a semiconductor chip in which the conductive path between the chip and the lead frame via wires can be easily and reproduceably improved. This is accomplished by improving the bond between the wires and the lead frame members to which the wires are joined and by creating additional contacts between each wire and its respective lead even if the bonded contact breaks or fails at or immediately adjacent to the bonding point.

It is another object of the invention to provide a packaged semiconductor chip with improved mechanical and electrical performance.

It is yet another object of the invention to provide a significantly thinner semiconductor package than that previously obtained in the prior art.

It is a further object of the present invention to provide a multiple chip semiconductor package with enhanced reliability.

It is still a further object of the invention to provide the chips in such multiple chip packages with an adhesive coating that will permit the stacking of chips in such a manner that they can be readily disassembled if defective chips are found in the stack.

These and other objects of the invention are provided by placing an insulating layer on the active surface of each semiconductor chip. The active surface of each chip being that surface, carrying input and output bonding pads thereon, to which lead frame conductors have been secured. Wires connect the bonding pads on the major surface of the semiconductor device to the lead frame conductors. The insulating layer is a thin insulating film coated with thermosetting adhesive and is placed over the lead frame and the bonding wires and the active face of the semiconductor chip. The surface of the film coated with the layer of thermosetting adhesive is arranged to abut the lead frame, the bonding wires and the active face of the chip so that when a lamination force is applied to the insulating film the wires will be crushed and held against their respective pads and against the respective leads to which they are connected. In this way greater contact between the wires and the leads is enhanced and defects or failure in conductivity therebetween reduced or eliminated.

These and other object, features and advantages of the invention will be apparent from the following more particular description of the preferred embodiment of the invention as illustrated in the accompanying drawings.

BRIEF DESCRIPTION OF THE DRAWINGS

FIG. 3 is a sectional view of the semiconductor chip after the coated insulating film has been pressed onto the semiconductor chip.

FIG. 4 is a sectional view taken orthogonal to the view of FIG. 3 showing the coated insulating film pressed onto the active face of the semiconductor chip.

DESCRIPTION OF THE PREFERRED EMBODIMENT

Figure 1:
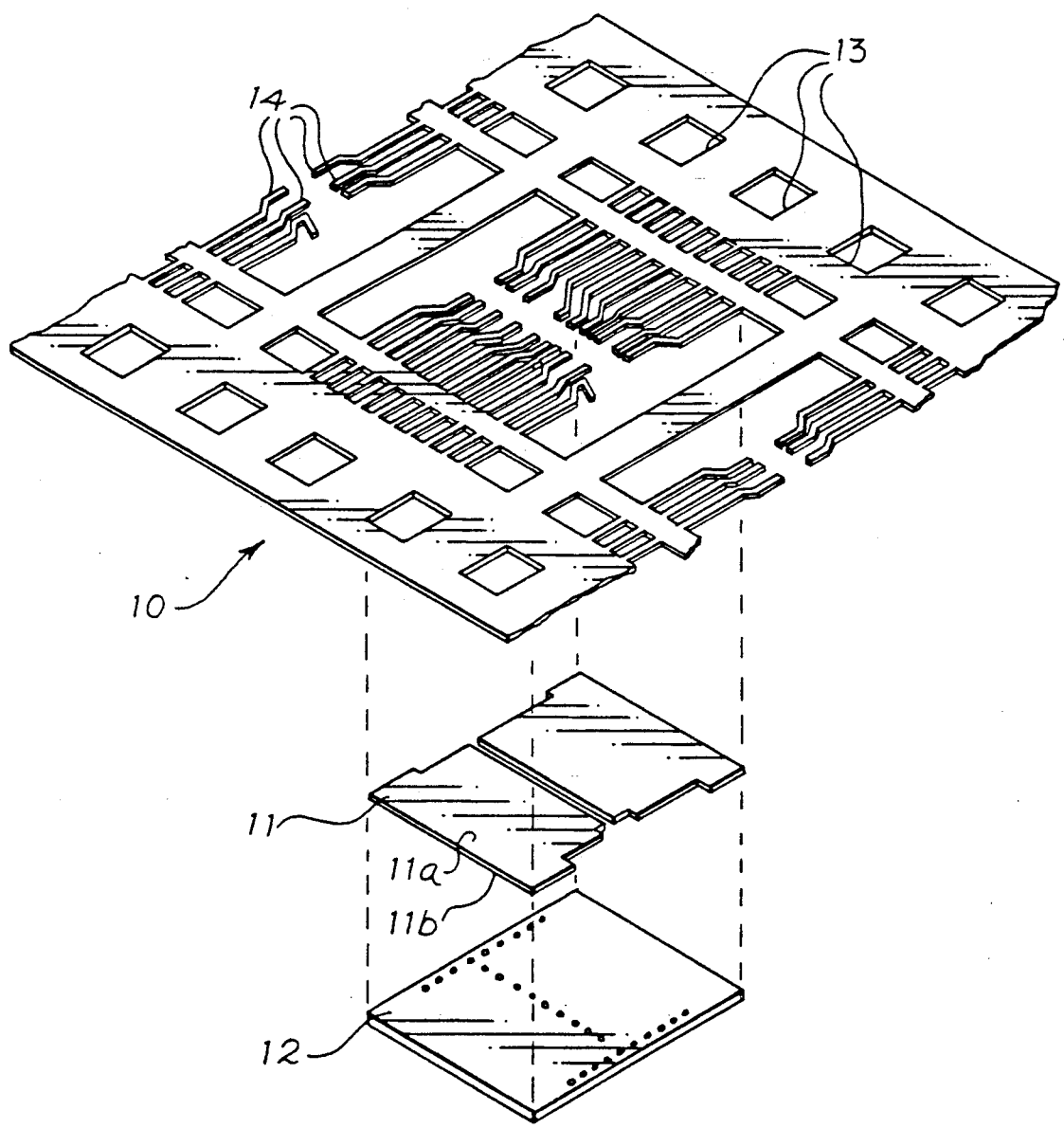
FIG. 1 is an exploded schematic representation of a wire bonded semiconductor chip on which a lead frame is positioned.

FIG. 1 is a schematic representation of an exploded view of a portion of the present invention and includes a lead frame 10, a layer 11 and a semiconductor chip 12. The lead frame 10 is produced from metal sheet stock and formed with a plurality of indexing holes 13 and contains lead frame conductors 14. Such lead frames 10 are preferably made from a copper alloy and are well known and have a definite meaning in the semiconductor art. The material, thickness and strength of such lead frames has long been known to the art such that the use of the term "lead frame" as used in the art is all that is necessary to purchase such items. In essence the term "lead frame" means a metal structure, preferably a plated copper alloy, formed from sheet stock and of a sufficient size and strength to meet specific mechanical strength requirements. For example, such a lead frame is shown in the Semiconductor International, April 1985. In the present invention the lead frame is typically between 0.003 and 0.015 inches thick and comprised of a number of conductors 14 between 0.006 and 0.017 inches wide. These conductors are thus of sufficient mechanical strength to be successfully handled and inserted into sockets or soldered otherwise connected to printed circuit boards. The portions of the lead frame conductors 14 which extend over the semiconductor chip 12 are separated from, but adhered to the semiconductor chip 12 by the layer 11.

The layer 11 is a polymer film which can stand a temperature in excess of 175 degrees centigrade and does not contain ionizable species such as halides and active metals, including sodium (Na), potassium (K) and phosphorus (P). The layer 11 can be formed, for example, of the polyimide film sold by the DuPont De Nemours Company under the tradename "Kapton". Such polyimide films are between 1.0 and 2.0 mils in thickness and can be thermally enhanced by aluminum or silicon nitride additions therein.

The layer 11 has adhesive coatings 11a and 11b, which are applied as thin films to the major surfaces of layer 11 and are used to help secure the layer 11 to the lead frame 10 and the chip 12. This layer 11 helps assure that short circuits between the lead frame and the chip do not occur. If desired, the adhesive layers applied to the different sides of layer 11 can be of different materials, for example, the adhesive coating 11b securing the layer 11 to the semiconductor chip 12 can be selected from the group of epoxies, acrylics, silicones and polyimides with epoxies being preferred. The other adhesive coating 11a which holds the lead frame conductors to the layer 11 can be selected from the same group of materials with the epoxies, acrylics and polyimides containing phenolics being preferred. One material suitable for use as the adhesive layers 11a and 11b is sold by the Rogers Corporation of Chandler, Ariz., under the tradename "Rogers 8970".

Figure 2:
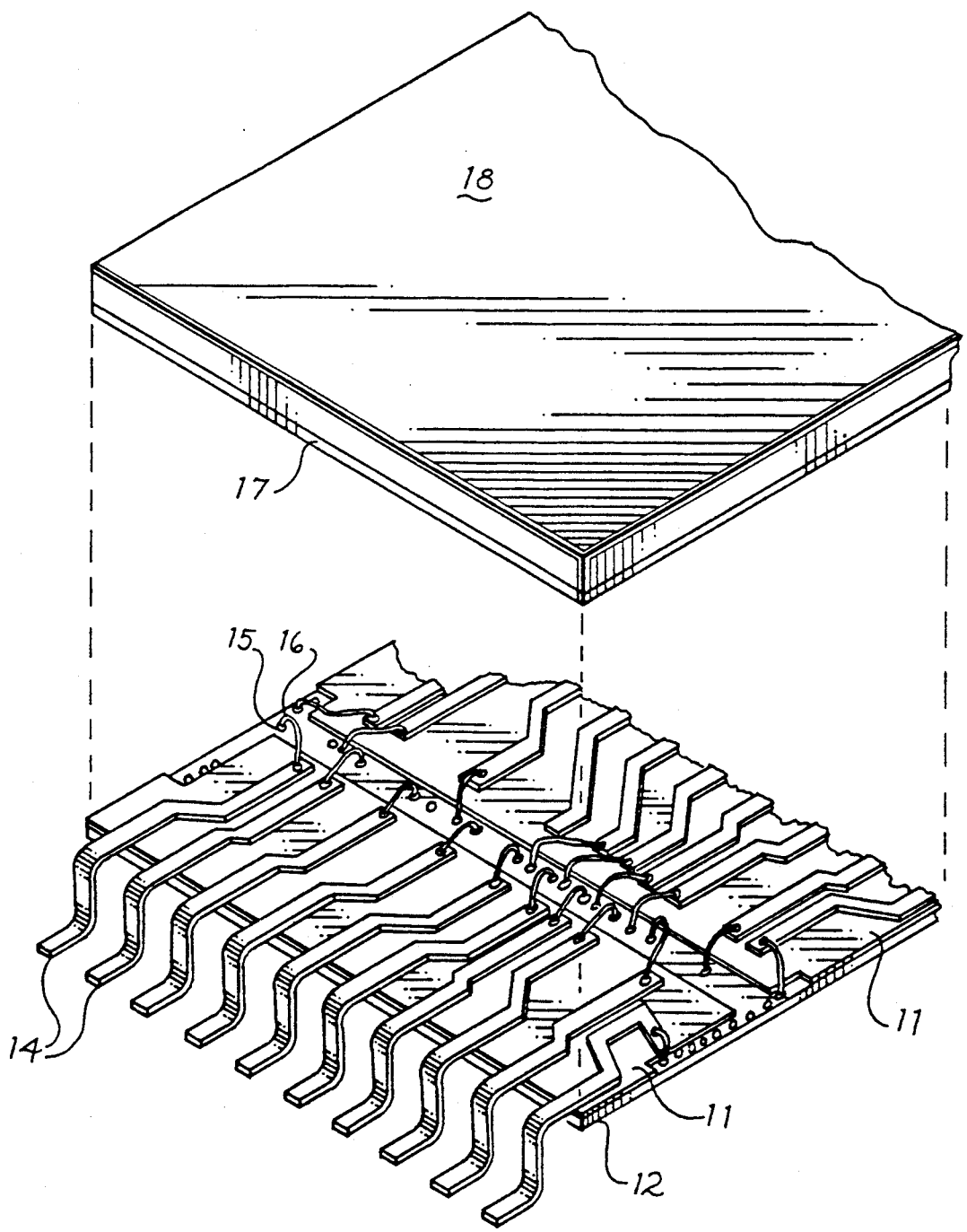
FIG. 2 shows the lead frame secured to the active face of a semiconductor chip and with bonding wires extending between pads on the chip and respective lead frame members together with the adhesively coated insulating film of the present invention positioned to be secured to the surface of the lead frame, the wires and the semiconductor chip.

FIG. 2 shows the lead frame conductors 14 of FIG. 1 bonded onto the semiconductor chip 12 via the insulating layer 11. It should be noted that in this view the selvage including the indexing holes 13 has been cut away from the lead frame conductors 14 and the conductors 14 have been formed using techniques well known to the art. In this FIG. 2 the lead frame conductors 14 have their ends overlying the surface of the semiconductor chip intimately connected to pads 15 on the semiconductor chip via gold wires 16 which are bonded to the chip pad 15 and to the ends of the lead frames 14. In lieu of the adhesive coated film shown in FIG. 1 the insulating layer 11 can consist solely of one of the above listed adhesives so long as the adhesive is either sufficiently dense enough or thick enough to electrically insulate the lead frame conductors from the chip surface. In such a case the adhesive layer can be applied to the lead frame conductors or to the top surface of the chip, i.e. the major upper surface of the chip which contains the chip terminals 15, to actually assure that there is no possibility of short circuit between the chip surface and the lead frame conductors.

Once the lead frame conductors 14 have been suitably secured to the surface of the chip and the wires 16 have been formed to connect the tips of selected lead frame conductors 14 and to selected chip terminals 15 a B-stage thermoset adhesive layer 17 is applied to a polyimide film 18 such as a "Kapton" film. The adhesive coated film is then placed over the lead frame conductors 14 in the region of the underlying chip 12. One such adhesive suitable for use in the present invention is an acrylic adhesive sold under the tradename "Pyralux" from the DuPont De Nemours Company and preferably is 3 to 10 mils in thickness. The adhesive coated film 18 is equal in size to the underlying chip 12 and aligned therewith. Once the film 18 is properly positioned over the chip 12 heat and force is applied thereto by a heated platen (not shown) such that the adhesive 17 on the film 18 is caused to be softened or melted and forced between the lead frame members 14 and around the wires 16. The force applied to the film 18 by the platen has to be sufficient not only to force the softened adhesive 17 between the lead frame members 14 but also sufficient to flatten the wires 16 against the respective pads and respective leads to which they are connected.

For the average semiconductor device, of 30 mils thickness the platen should apply a force in the order of 10 grams/sq. inch and a temperature sufficient to heat the film to 150° C. This step requires that both the force and temperature to be applied to the adhesive coated film 18 when its in contact with the chip and maintained for a period of 22 seconds. After the wires 16 have been flattened and the adhesive 17 forced around them the adhesive can be fully cured by placing the unit into an oven, heated to 150° C., for about one hour.

As shown in FIGS. 3 and 4, the wires 16 are crushed by the applied force against the top surface of the respective lead conductors 14 and semiconductor chip pads. Because of the softening action that occurs in the layer 17, it is forced between each of the lead frame conductors as shown in FIG. 14 until it contacts the adhesive layer 11. As the wires 16 are crushed against the bond pads and against the conductors 14 additional highly reliable wire to pad or wire to conductors electrical contacts are made therebetween. Such good contacts are created even if the wire bond, previously made was poor or had failed in its initial juncture. The applied force assures that a significantly larger surface of the wire is in good electrical contact with the lead frame conductor thus eliminating a number of the previously known defects. This increases reliability in the final product.

The device thus described is particularly suitable for stacking to form a so-called chip cube because of the smallness and reliability of the package.

Figure 5:
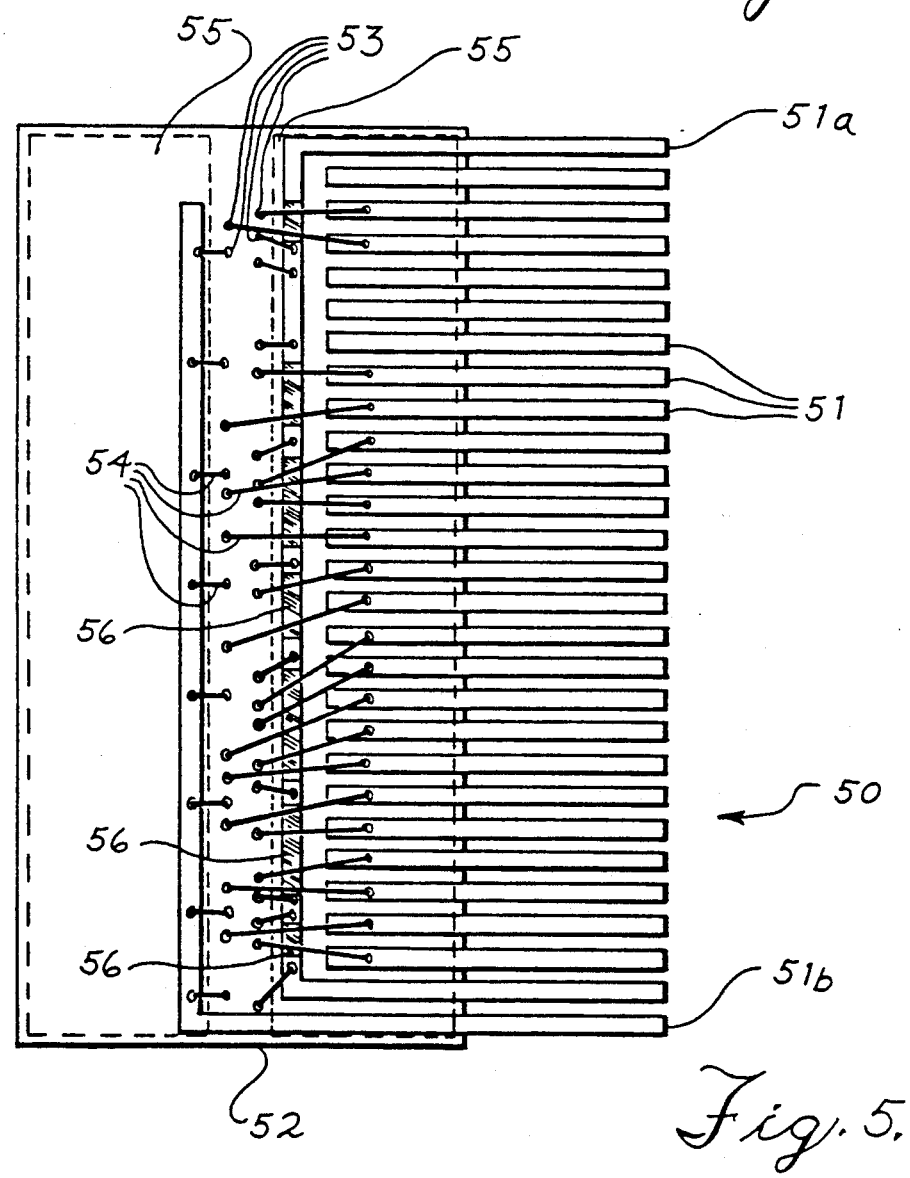
FIG. 5 is a top view that illustrates a different form of construction in which the lead frame configuration consists of leads extending from only one side of the semiconductor chip.

FIG. 5 shows an arrangement of the invention particularly adopted for stacking in a cube because it has its leads extending from only one side of the chip. It, of course, should be clearly understood that although this is the inventors preferred arrangement for their present applications that two side arrangements as shown in FIGS. 1 and 2 can also be stacked.

FIG. 5 shows a lead frame 50 comprised of a plurality of conductors 51 which are all located in the chip 52 so that they extend from the chip package in only one direction. The chip 52 is provided with a plurality of chip pads 53 generally positioned along the central position of the chip. It, of course, should be understood that pad arrangements could also be provided at the perimeter of the chip shown in FIG. 2. Wire bonds 54 are formed between selected chip pads 53 and selected conductors 51. It should be noted that one of the leads 51a is formed in a general u-shape so that a portion thereof lies transverse to most of the other conductors 51 and between the inner ends of the conductors 51 and the chip pads 53. It should be further noted that a second lead 51b is generally L-shaped and lying on the other side of the chip pads 53 from the control portion of the lead 51a. Because the wires 54 are forced down during the placement of the top film 17, as shown in FIGS. 2, 3 and 4, it is necessary that portions of the lead frame conductors 51a be, not only insulated from the chip by layers 55, but also, as shown by the cross-hatching beneath the lead frame conductors 51, insulated on its top surface in the regions 56 where wires pass over to connect lead frame conductors to the respective chip pads. This insulation can be any suitable polymer such as is sold under the tradename "Hysol SR1020". This material can be silk screened on the lead frame conductor 51a after it is placed on the chip surface or can be in the form of a decal applied thereto. The insulating material 56 can be comprised of the same materials as is layer 11 as discussed in conjunction with FIG. 1 and FIG. 2 above, and would be placed on the transverse portion of the lead frame conductor 51a by a number of suitable methods known to the art. Alternately, the wires themselves could be coated with the insulating material.

Figure 6:
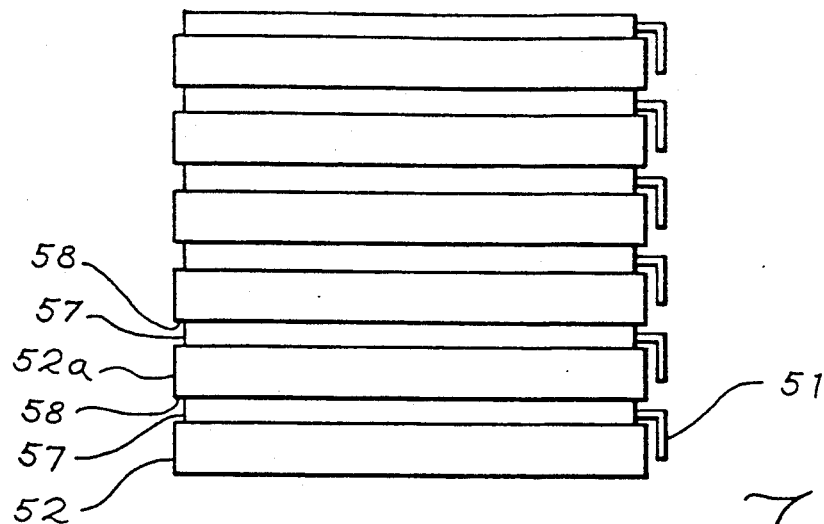
FIG. 6 illustrates an assembly in which a multiplicity of chips formed by the invention, as shown in FIG. 5, are arranged in a stack or cube configuration.

Once the wire bonds are made between the chip pads and the respective lead frame conductors a film, 57 such as "Kapton", is disposed over the wires and lead frame conductors as taught above in conjunction with FIGS. 1 through 4 and shown in FIG. 6.

FIG. 6 shows a plurality of the single ended chip packages 52 shown in FIG. 5 arranged in a stacked configuration. This stacked configuration is achieved by overlying the film 57 with a thermoplastic polyimide adhesive 58 such as is sold by the 3M Company under the tradename "Scotch Brand 586". By placing this adhesive 58 on the top surface of the film 57 an individual package can be joined to the exposed bottom of the chip 52 in the next adjacent package by the adhesive.

With the adhesive layer 58 in place on the surface of the film 57 such packages can be joined to form the stacked configuration shown in FIG. 6. Thus, as shown in FIG. 6, a package 52 is secured to the next adjacent package 52a by placing the adhesive layer 58 overlying the film 57 against the exposed bottom of the chip in the next adjacent package 52a.

Because the adhesive 58 is a thermoplastic adhesive the stack requires a heating step to cause the adhesive coating 58, disposed on the film 57, to bond securely to the exposed bottom of the semiconductor chip, in the next package in the stack, which it is abutting. In the described embodiment a temperature of about 230° C. is used. This temperature is below the melting or softening point of any of the materials used in the stack of chips other than the adhesive layer 58. This step causes the adhesive 58 to secure the film 57 of one package 52 to be bonded to the bottom of the chip in the next adjacent package 52a.

A stack of chips of any number may be assembled in this manner.

Once the chip stack is so assembled it can be tested and used. If during test or subsequent use one or more of the chips are found to be defective the stack can be disassembled. This disassembly can be done by heating the stack to a temperature of 210° C. at which the adhesive layer readily delaminates from the bottom of the silicon chip to which it is secured. It does not however delaminate from the "Kapton" film 57 to which it is also secured. By following this procedure the stack can easily be separated into individual packages.

Once the stack is separated individual packages can be replaced and the stack reassembled or reformed by again heating the stack to 230° C. as discussed above.

This completes the description of the preferred embodiments of the invention. Other alterations and modifications thereto will now become apparent to those skilled in the art without departing from the spirit and scope of the invention as set forth in the following claims.

What is claimed is:

1. A method of forming a semiconductor package comprising the steps of:
   providing a semiconductor chip having first and second major surfaces with input and output bonding pads on the first major surface,
   providing a lead frame having a plurality of leads adjacent said chip,
   electrically connecting respective ones of the leads to respective ones of the bonding pads on the chip by conductive bonding wires therebetween,
   placing an insulating film having a thermosetting plastic adhesive coating on a surface thereof over the lead frame, the first major surface of the chip and the wires, with the coated surface abutting the lead frame and the wires,
   applying a force on the insulating film sufficient to force the wires against the respective pads and the respective leads to which they are bonded and sufficient to force the thermosetting plastic adhesive coating between the leads, and
   heating the film to cure the thermosetting plastic adhesive coating.

2. A method of forming a stack of semiconductor chip packages comprising the steps of: forming a plurality of semiconductor chip packages, each package being formed by a method comprising the steps of: providing a chip having a first major surface containing a plurality of input/output bonding pads thereon and a second major surface,
   providing a lead frame having a plurality of leads adjacent said chip,
   electrically connecting each of the leads to respective bonding pads on the first major surface of the chip with bonding wires,
   selecting an insulating film with first and second major surfaces, covering the first major surface of said film with a thermosetting plastic adhesive coating, placing the coated insulating film over the lead frame and the bonding wires with the thermosetting plastic adhesive coating abutting the lead frame and the wires,
   applying a force on the insulating film sufficient to force the wires against the respective pads and the respective leads to which they are connected and sufficient to force the thermosetting plastic adhesive coating between the leads of the leadframe, and heating the film to cure the thermosetting plastic adhesive coating,
   treating the second major surface of the film on each chip package so formed by applying an adhesive thereto,
   aligning a plurality of said treated chip packages with the adhesive treated second major surface of each film, abutting the second major surface of the chip in an adjacent package,
   heating the aligned packages to secure said adhesive on each package to said second major surface of said chip in the adjacent package.

3. The method of claim 1 wherein said film is heated to about 150° Celsius.

4. The method of claim 1 wherein the film is heated in an oven to about 150° Celsius for one hour.

5. The method of claim 2 wherein the thermoplastic coating comprises a thermoplastic polyimide adhesive.

6. The method of claim 2 wherein said aligned packages are heated to about 230° Celsius and said method further includes the steps of disassembly of the stack by heating the stack to a temperature of about 210° Celsius, removing at least one of said packages from said stack, restacking the packages, and heating said restacked packages to a temperature of about 230° Celsius.

7. The method of claim 2 wherein said film is heated to about 150° Celsius.

8. The method of claim 2 wherein said method further includes the steps of disassembly of the stack by heating the stack to a temperature of about 210° Celsius, removing at least one of said packages from said stack, restacking the packages, and heating said restacked packages to a temperature of 230° Celsius.

9. A method of forming a semiconductor package comprising the steps of:

securing an insulating layer on a major surface of a semiconductor chip having input and output bonding pads on the major surface, securing a lead frame having a plurality of leads on the insulating material, connecting respective ones of the leads to respective ones of the bonding pads on the chip by conductive bonding wires therebetween, placing an insulating film having a thermosetting plastic adhesive coating on a surface thereof over the lead frame and the wires, with the coated surface abutting the lead frame and the wires, applying a force on the insulating film sufficient to force the thermosetting plastic adhesive coating between the leads and sufficient to force the wires against the respective pads and the respective leads to which they are bonded, and heating the film to cure the thermosetting plastic adhesive coating.

10. A method of forming a stack of semiconductor chip packages comprising the steps of:

forming a plurality of semiconductor chip packages each package being formed by a method comprising the steps of:

providing a chip having a first major surface containing a plurality of input/output bonding pads thereon and a second major surface, placing an insulating layer on the first major surface of a semiconductor chip, securing a lead frame having a plurality of leads on the insulating layer, connecting each of the leads to respective bonding pads on the first major surface of the chip with wires, selecting an insulating film with first and second major surfaces, covering the first major surface of said film with a thermosetting plastic adhesive coating, placing the coated insulating film over the lead frame and the bonding wires, with the thermosetting plastic adhesive coating abutting the lead frame and the wires, applying a force on the insulating film sufficient to force the thermosetting plastic adhesive coating between the leads of the lead frame and sufficient to force the wires against the respective pads and the respective leads of the lead frame to which they connect, and heating the film to cure the thermosetting plastic adhesive coating, coating the second major surface of the insulating film on each chip package so formed with a thermoplastic adhesive, aligning a plurality of said coated chip packages with the thermoplastic adhesive coated second major surface of each insulating film, abutting the second major surface of the chip in an adjacent package, heating the aligned package to at least 230° Celsius to secure said thermoplastic adhesive to said second major surface of said chip in the adjacent package.

11. The method of claim 10 wherein the thermoplastic adhesive coating the insulating film comprises a thermoplastic polyimide adhesive.

* * * * *